(12) United States Patent
Jeddeloh et al.

(10) Patent No.: US 7,521,948 B2
(45) Date of Patent: Apr. 21, 2009

(54) INTEGRATED CIRCUIT LOAD BOARD AND METHOD HAVING ON-BOARD TEST CIRCUIT

(75) Inventors: Joseph M. Jeddeloh, Shoreview, MN (US); Robert Totorica, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/784,346

(22) Filed: Apr. 6, 2007

(65) Prior Publication Data

US 2007/0200579 A1 Aug. 30, 2007

Related U.S. Application Data

(62) Division of application No. 11/195,514, filed on Aug. 1, 2005, now Pat. No. 7,319,340.

(51) Int. Cl.
*G01R 31/02* (2006.01)
(52) U.S. Cl. ......... 324/754; 324/765
(58) Field of Classification Search .......... None
See application file for complete search history.

(56) References Cited

U.S. PATENT DOCUMENTS

| | | | |
|---|---|---|---|
| 4,637,020 A | 1/1987 | Schinabeck | 371/20 |
| 4,646,299 A | 2/1987 | Schinabeck et al. | 371/20 |
| 4,717,012 A | 1/1988 | Swapp et al. | 198/425 |
| 4,776,747 A | 10/1988 | Swapp et al. | 414/417 |
| 4,928,062 A | 5/1990 | Miles et al. | 324/158 R |
| 5,055,779 A | 10/1991 | Kerschner et al. | 324/158 F |
| 5,321,702 A | 6/1994 | Brown et al. | 714/744 |
| 5,446,395 A * | 8/1995 | Goto | 324/763 |
| 5,539,305 A | 7/1996 | Botka | 324/158.1 |
| 5,652,524 A | 7/1997 | Jennion et al. | 324/765 |
| 5,751,151 A | 5/1998 | Levy et al. | 324/537 |
| 5,805,619 A | 9/1998 | Gardner et al. | 714/814 |
| 5,864,565 A | 1/1999 | Ochoa et al. | 371/24 |
| 5,903,163 A | 5/1999 | Tverdy et al. | 324/760 |
| 6,004,142 A | 12/1999 | Wark | 439/74 |
| 6,087,857 A | 7/2000 | Wang | 327/5 |
| 6,147,506 A | 11/2000 | Ahmad et al. | 324/760 |
| 6,219,305 B1 | 4/2001 | Patrie et al. | 368/113 |
| 6,369,601 B1 | 4/2002 | Ishigaki | 324/765 |
| 6,373,268 B1 | 4/2002 | Dunlap et al. | 324/755 |
| 6,380,755 B1 * | 4/2002 | Sato | 324/765 |
| 6,400,173 B1 * | 6/2002 | Shimizu et al. | 324/765 |
| 6,407,567 B1 | 6/2002 | Etter | 324/760 |
| 6,438,721 B1 | 8/2002 | Wente | 714/731 |
| 6,449,741 B1 | 9/2002 | Organ et al. | 714/724 |
| 6,551,844 B1 | 4/2003 | Eldridge et al. | 438/14 |

(Continued)

*Primary Examiner*—Vinh P Nguyen
(74) *Attorney, Agent, or Firm*—Dorsey & Whitney LLP (57) ABSTRACT

An integrated circuit load board includes a substrate on which a plurality of integrated circuit sockets and an integrated test circuit are mounted. The integrated test circuit generates test signals that are applied to the integrated circuit sockets. The integrated test circuit also receives response signals from the integrated circuit sockets indicative of the manner in which integrated circuits in the sockets responded to the test signals. Several of the load boards may be placed on a test head that may be coupled to a host. The integrated test circuit may also be used with an integrated circuit probe card, where the test signals are applied to an integrated circuit coupled to the probe card.

11 Claims, 6 Drawing Sheets

U.S. PATENT DOCUMENTS

| | | | |
|---|---|---|---|
| 6,583,636 B2 | 6/2003 | Brule | 324/755 |
| 6,631,488 B1 | 10/2003 | Stambaugh et al. | 714/746 |
| 6,642,736 B2 * | 11/2003 | Mori et al. | 324/765 |
| 6,696,848 B2 | 2/2004 | Robinson | 324/755 |
| 6,791,317 B1 | 9/2004 | Walsh et al. | 324/158.1 |
| 6,829,181 B1 | 12/2004 | Seitoh | 365/201 |
| 6,856,154 B2 | 2/2005 | Song et al. | 324/754 |
| 6,930,503 B2 * | 8/2005 | Sher et al. | 324/765 |
| 7,188,219 B2 | 3/2007 | Jeddeloh | 711/154 |
| 7,213,082 B2 | 5/2007 | Jeddeloh | 710/5 |
| 7,234,070 B2 | 6/2007 | James | 713/503 |
| 7,243,278 B2 | 7/2007 | Arkin | 714/724 |
| 2004/0034825 A1 | 2/2004 | Jeddeloh | 714/733 |
| 2005/0023560 A1 | 2/2005 | Ahn et al. | 257/200 |
| 2005/0060600 A1 | 3/2005 | Jeddeloh | 714/5 |
| 2005/0278495 A1 | 12/2005 | Lee | 711/168 |
| 2005/0283681 A1 | 12/2005 | Jeddeloh | 714/42 |
| 2006/0107186 A1 | 5/2006 | Cowell et al. | 714/776 |
| 2006/0206761 A1 | 9/2006 | Jeddeloh | 714/29 |
| 2007/0024306 A1 | 2/2007 | Jeddeloh et al. | 324/763 |
| 2007/0038907 A1 | 2/2007 | Jeddeloh et al. | 714/718 |
| 2007/0041255 A1 | 2/2007 | Jeddeloh | 365/201 |

* cited by examiner

INTEGRATED CIRCUIT LOAD BOARD AND METHOD HAVING ON-BOARD TEST CIRCUIT

CROSS-REFERENCE TO RELATED APPLICATION

This application is a divisional of U.S. patent application Ser. No. 11/195,514, filed Aug. 1, 2005, now U.S. Pat. No. 7,319,340.

TECHNICAL FIELD

This invention relates to testing devices for integrated circuits such as memory devices, and, more particularly, to a relatively inexpensive method and system for high speed testing of integrated circuits.

BACKGROUND OF THE INVENTION

During the fabrication of such integrated circuits as memory devices, it is conventional to test the integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board, and these conductors are connected to the integrated circuits. The test head is connected through a cable to a high-speed tester so that the tester can apply signals to and receive signals from the integrated circuits.

While the above-described testing environment works well in many applications, it is not without its limitations and disadvantages. For example, it is very difficult to test various timing characteristics of the integrated circuits, particularly at the high operating speeds for which such integrated circuits are designed. This difficulty results primarily from the propagation delays in transferring signals through the cable between the tester to the test head. The cables that are typically used in such testing environments are often fairly long, thus making the propagation delays of signals coupled to and from the integrated circuits correspondingly long and often difficult to predict.

Another problem with the above-described testing environment is that it may not accurately simulate the conditions in which the integrated circuits will be actually used. In actual use, integrated circuits, such as dynamic random access memory ("DRAM") devices, are typically mounted on a printed circuit board. Signals are applied to the integrated circuits by other integrated circuits mounted on the board, and signals generated by the integrated circuits are received by other integrated circuits mounted on the board. Most of the signals are not coupled to and from the integrated circuits through long cables coupled to distant electronic devices. Therefore, the testing environment is normally quite different from the environment in which the integrated circuits will operate in normal use.

While techniques have been developed to deal with these difficulties, the use of these techniques results in testers that are highly complex and often very expensive. A large number of testers are normally required for a high capacity semiconductor fabrication plant, thus greatly increasing the cost of the plant and the expense of testing the integrated circuits.

There is therefore a need for a testing system and method that can inexpensively test integrated circuits at high speed, and do so in an environment that accurately simulates the conditions in which the integrated circuits are likely to be used in normal operation.

SUMMARY OF THE INVENTION

A system and method of testing integrated circuits includes a load board on which the integrated circuits are removably mounted. The load board includes an integrated test circuit that generates test signals responsive to a test command coupled to the load board. As a result, the test signals applied to the integrated circuits are generated on the load board itself. The integrated test circuit also receives test results data from the integrated circuits on the load board. The test results data may be indicative of the manner in which the integrated circuits responded to the test signals. Information corresponding to the test results data is then coupled from the load board. A plurality of the load boards may be removably placed on a test head. The test head applies test commands to the load boards to cause the load boards to apply the test signals to the integrated circuits. The test head may also receive from the load boards the information corresponding to the test results data. The test head may be coupled to a host to which it can supply the information corresponding to the test results data.

DETAILED DESCRIPTION

Figure 1:
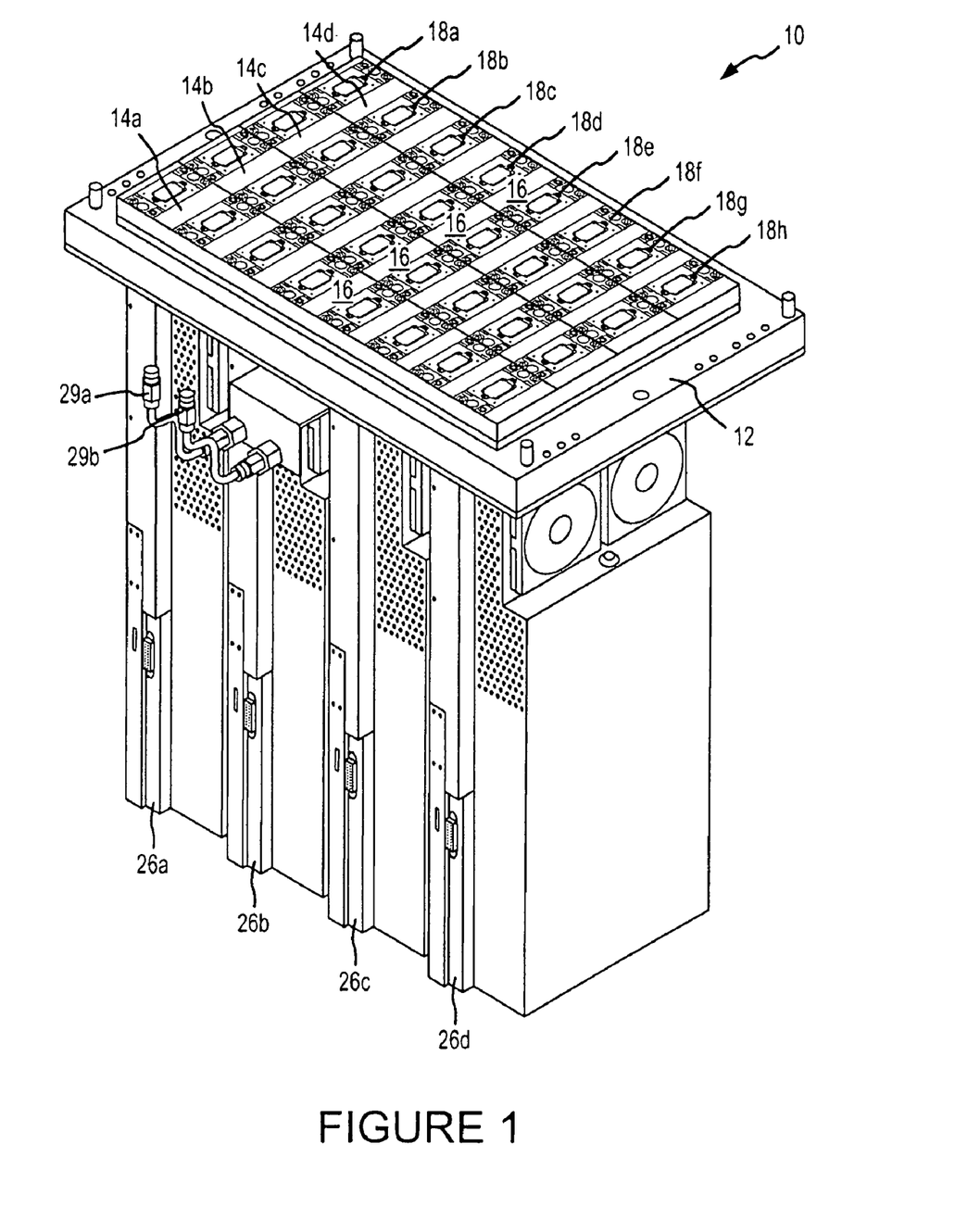
FIG. 1 is an isometric view of a test system 10 according to one example of the invention.

A test system 10 according to one example of the invention is illustrated in FIG. 1. The test system 10 includes a test head 12 on which several load boards 14a-d are placed. Each of the load boards 14a-d have a printed circuit substrate 16 on which several integrated circuit sockets 18a-h are mounted. Each of the integrated circuit sockets 18a-h receives a respective integrated circuit (not shown in FIG. 1). In the example shown in FIG. 1, the sockets 18a-h are adapted to receive integrated circuit memory devices, such as dynamic random access memory ("DRAM") devices. Prior to final testing of the integrated circuits, an integrated circuit handler (not shown) loads an integrated circuit into each of the sockets 18a-h, and then places each of the load boards 14a-d on the test head 12.

Figure 2A:
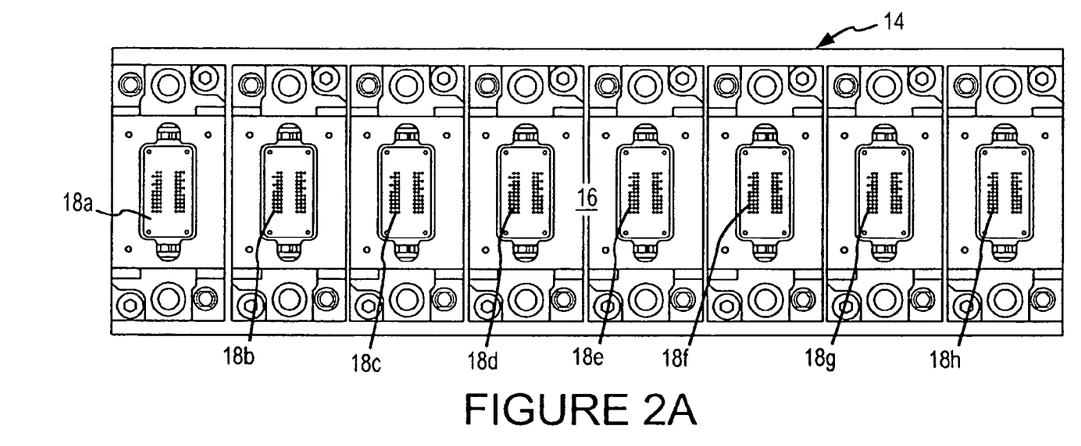
FIGS. 2A and 2B are top and bottom plan views, respectively, of a load board used in the test system of FIG. 1.
Figure 2B:
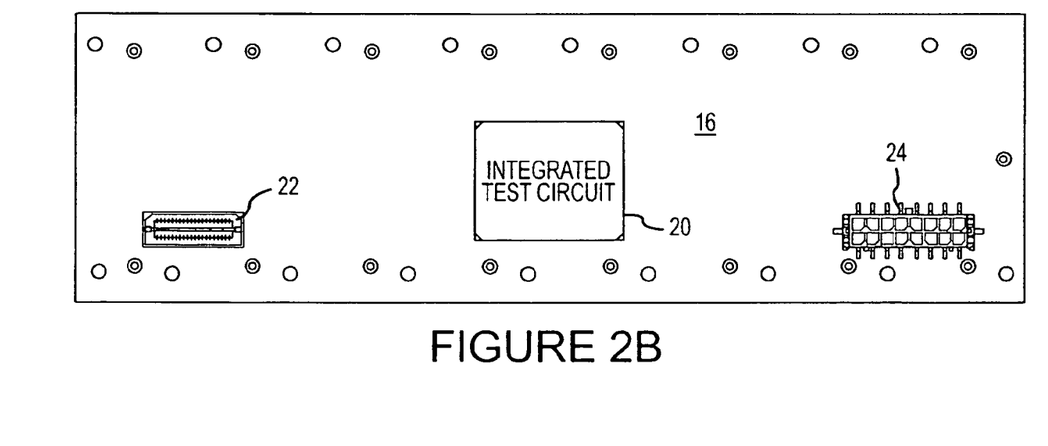

As explained in greater detail below, each of the load boards 14a-d includes an integrated test circuit (not shown in FIG. 1) mounted on the surface of the substrate 16 opposite the service on which the sockets 18a-h are mounted. The sockets 18a-h are shown mounted on the upper surface of the substrate 16 in greater detail in FIG. 2A. The lower surface of the substrate 16 is shown in FIG. 2B. The integrated test circuit 20 is mounted at the center on the lower surface of the substrate 16, and it is connected to the sockets 18a-h through conventional printed circuit traces (not shown in FIG. 2B). Also mounted on the lower surface of the substrate 16 are a conventional JTAG connector 22 and a power supply connector 24. As explained in greater detail below, a test file containing test instructions, such as the characteristics of memory commands used by memory devices in the sockets 18*a-h* or the address range to be tested, are applied to the integrated test circuit 20 through the JTAG connector 22. The test file is stored in random access memory ("RAM") internal to the integrated test circuit 20. Results data are subsequently received from the integrated test circuit 20 through the JTAG connector 22. Power is applied to the integrated test circuit 20 as well as to integrated circuits mounted in the sockets 18*a-h* through the power supply connector 24. The integrated test circuit 20 includes a command generator (not shown) that generates memory command signals, and an address generator (not shown) that generates memory address signals. The integrated test circuit 20 also contains a write data generator (not shown) including a pattern generator that generates a pattern of write data signals.

In operation, the integrated test circuit 20 write a pattern of signals to the integrated circuits mounted in the sockets 18*a-h* by coupling appropriate command and address signals, as well as the pattern of write data, to the integrated circuits mounted in the sockets 18*a-h*. In response to coupling appropriate command and address signals generated by the integrated test circuit 20, the integrated test circuit 20 receives read data from the integrated circuits. The integrated test circuit 20 compares the read data to the write data to determine if the integrated circuits in the sockets 18*a-h* are functioning properly. Insofar as the integrated test circuit 20 is mounted on the same substrate 16 as the integrated circuits, the timing at which the signals in the pattern are applied to the integrated circuits can be more precisely controlled. Furthermore, the relatively short length of the conductors extending from the integrated test circuit 20 to the integrated circuits in the sockets 18*a-h* allows the circuitry in the integrated test circuit 20 to be less complex and therefore less expensive than with testers in which a pattern of test signals is applied through a long cable.

With further reference to FIG. 1, the test head 12 is mounted on the upper ends of several power supplies 26*a-d*, which generate DC supply voltages at respective magnitudes for use by the test head 12 and the load boards 14*a-d*. As mentioned above, the DC supply voltages are applied to the test head 12 through the power supply connector 24 (FIG. 2B). The test head 12 also includes fluid couplings 29*a,b* that receive and discharge a cooling fluid, respectively, for maintaining the temperature of the integrated test circuit 20 at a constant acceptably cool temperature.

Figure 3:
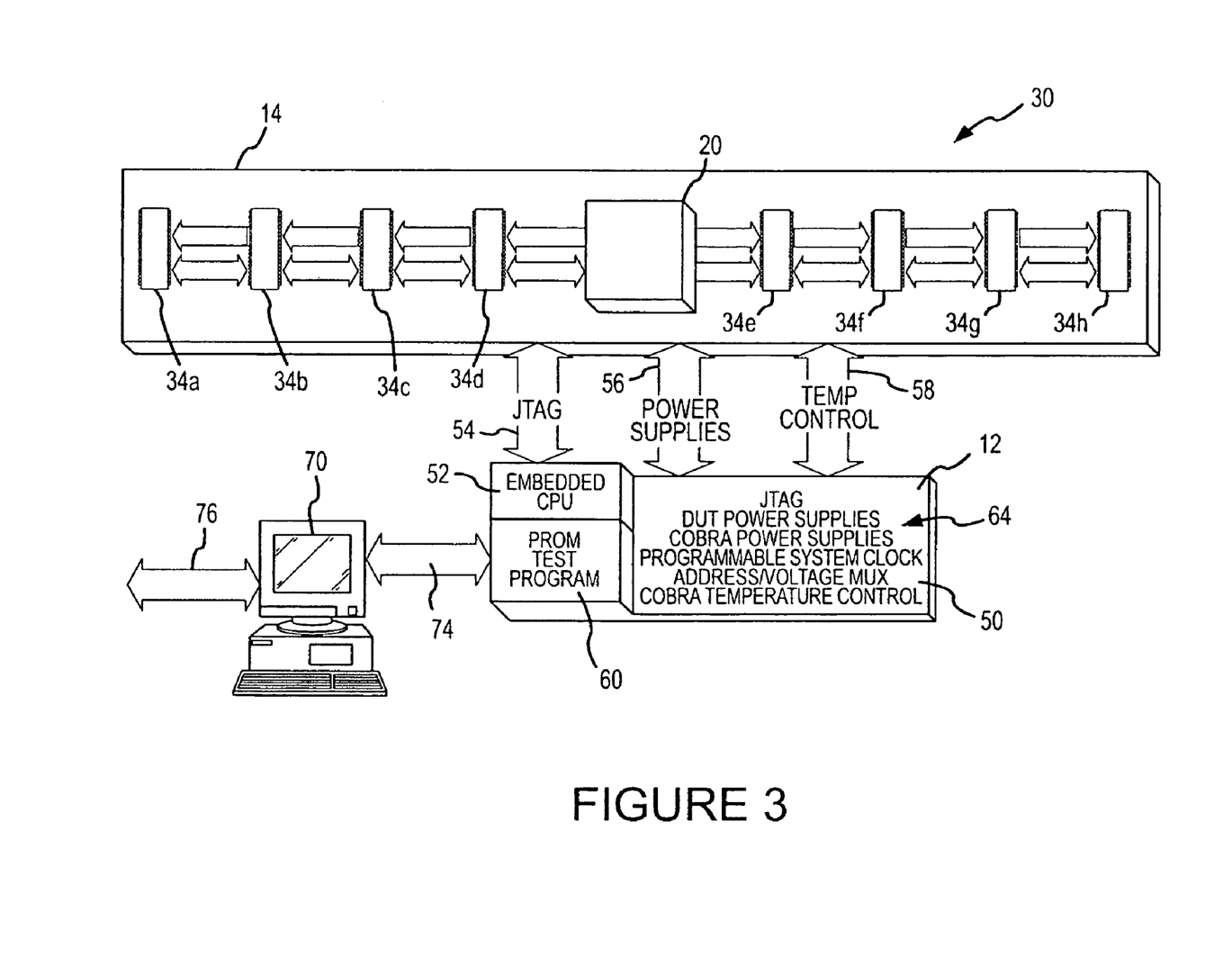
FIG. 3 is a block diagram of the test system of FIG. 1.

The basic components of a test system 30 that includes the test head 12 and load boards 14*a-d*, as well as a host, is shown in FIG. 3. In the example shown in FIG. 3, eight memory devices 34*a-h* are mounted on each of the load boards 14*a-d* (only one load board 14 is shown in FIG. 3). The memory devices 34*a-h* are coupled to the integrated test circuit 20 through a common uni-directional address/control bus and a common bi-directional data bus.

The test head 12 includes interface circuitry 50, including an embedded CPU 52. The interface circuitry 50 is coupled to the load board 14 through a conventional JTAG bus 54 and the JTAG connector 22 (FIG. 2B). The interface circuitry 50 supplies power to the load board 14 through power supply lines 56 and the power supply connector 24 (FIG. 2B). Finally, the interface circuitry 50 includes temperature control lines 58 that provide signals indicative of the temperature of the load board 14. The interface circuitry 50 includes a test program, which may be stored in a programmable read only memory ("PROM") 60 included in the interface circuitry 50. This test program performs tests on a programmable system clock, address/voltage multiplexers, and temperature control circuits 64 which are included in the interface circuitry along with the CPU 52

In operation, the interface circuitry 50 receives a test file from a host 70, which may be a conventional personal computer. The host 70 is coupled to the interface circuitry 50 through suitable means, such as a Local Ethernet network 74. The host 70 may also be coupled to a larger network, such as a production management system, through a Corporate Ethernet network 76. The interface circuitry 50 then passes the test file onto the integrated test circuit 20, which then applies a pattern of write data signals to the integrated circuits 34*a-h* with precisely controlled timing. The integrated test circuit 20 then receives read data signals from the integrated circuits 34*a-h* and outputs test result data to the CPU 52. The CPU 52 outputs the test data to the host 70. In the event the integrated circuits 34*a-h* are devices other than memory devices, the integrated test circuit 20 generates signals other than memory command, address and data signals to write a pattern of data to the memory devices with precisely controlled timing. After the pattern of data have been written to the memory devices, the integrated test circuit 20 generates command and address signals to read the contents of the memory devices, and it compares the read data with the write data to determine if the memory devices properly stored the write data. The integrated test circuit 20 formulates the test results into high-level test data, which it passes to the test head 12 through the JTAG bus 54. The test head 12, in turn, collects the test data and sends it to the host 70 through the Local Ethernet network 74.

Figure 4:
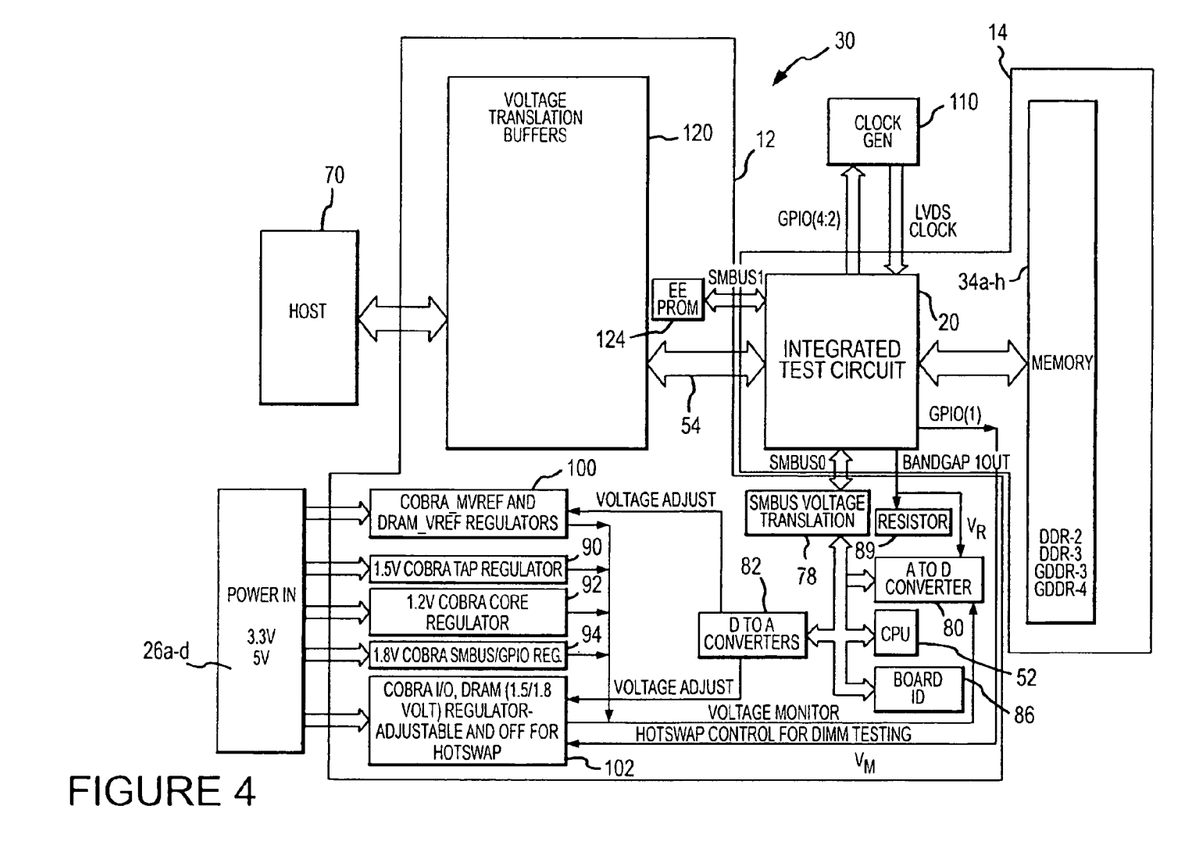
FIG. 4 is a more detailed block diagram of a test head used in the test system of FIG. 1.

The circuitry in the load board 14 and the test head 12 are shown in greater detail in FIG. 4. FIG. 4 shows the integrated test circuit 20 coupled to the memory devices 34*a-h*. The integrated test circuit 20 has a system management bus ("SMBus") that is coupled to several components in the test head 12. More specifically, the SMBus is coupled through a voltage translation buffer 78 to an analog-to-digital converter 80, a digital-to-analog converter 82, a board identifier 86, which outputs data indicative of the identity of the load board 14, and a CPU 52. The integrated test circuit 20 includes a Bandgap reference generator (not shown) that outputs a precisely controlled current. This current is converted to a reference voltage $V_R$ by passing the reference current through a resistor 89 in the test head 12. The reference voltage $V_R$ is applied to the analog-to-digital converter 80, which also receives a monitored voltage $V_M$. The analog-to-digital converter 80 outputs a digital value indicative of either the reference voltage $V_R$ or the monitored voltage $V_M$, and this digital value is coupled to the CPU 52 through the SMBus.

The test head 12 receives supply voltages from the power supplies 26*a-d* (FIG. 1), and includes voltage regulators 90, 92, 94 that regulate the power supply voltages to fixed magnitudes of 1.5V, 1.2V and 1.8V. The test head 12 also includes adjustable voltage regulators 100, 102 that generate variable voltages. The magnitudes of the variable voltages are controlled by the magnitudes of voltage adjust signals generated by the digital-to-analog converter 82 responsive to digital signals received from the CPU chip 52 through the SMBus.

The integrated test circuit 20 also receives a clock signal from a clock generator 110 having a frequency that is determined by a digital signal from the integrated test circuit 20. The frequency of the clock signal controls the rate at which command, address and write data signals are transferred to the memory devices 34*a-h* and read data are transferred from the memory devices 34a-h. The integrated test circuit 20 is therefore able to test the memory devices 34a-h over a wide range of operating speeds.

As explained above, the integrated test circuit 20 outputs test results through the JTAG bus 54. The JTAG bus 54 is coupled to voltage translation buffers 120, which convert the signals from logic levels used by the integrated test circuit 20 to logic levels used by the host 70, which, as explained above with reference to FIG. 3, is coupled to the test head 12.

Finally, the integrated test circuit 20 is coupled to an electrically eraseable programmable read-only memory ("PROM") 124, which contains calibration data that precisely characterizes the timing characteristics of the integrated test circuit 20. As a result, differences in the timing characteristics of the signals generated by the integrated test circuit 20 can be compensated for so that the timing characteristics of the signals applied to integrated circuits being tested can be precisely controlled.

In operation, the CPU 52 applies test commands to the integrated test circuit 20, as explained above. These test commands might be, for example, simply a command to write specific data values to a specific address in the memory devices 34a-h. The integrated test circuit 20 responds to the test commands by generating command, address and write data signals that cause the write data to be written to the memory device 34a-h. At the same time, the analog-to-digital converter 80 monitors the reference voltage from the resistor 89 and the adjustable voltage regulators 100, 102. After comparing the monitored voltages $V_M$ from the regulators 100, 102 to the reference voltage $V_R$, the CPU 52 adjusts the variable voltages to the desired values by outputting corresponding voltage control data to the digital-to-analog converter 82. As a result, the integrated test circuit can test the memory devices 34a-h with different supply voltage values, at different operating speeds, and, as explained below, with different timings of the command, address and data signals.

Figure 5:
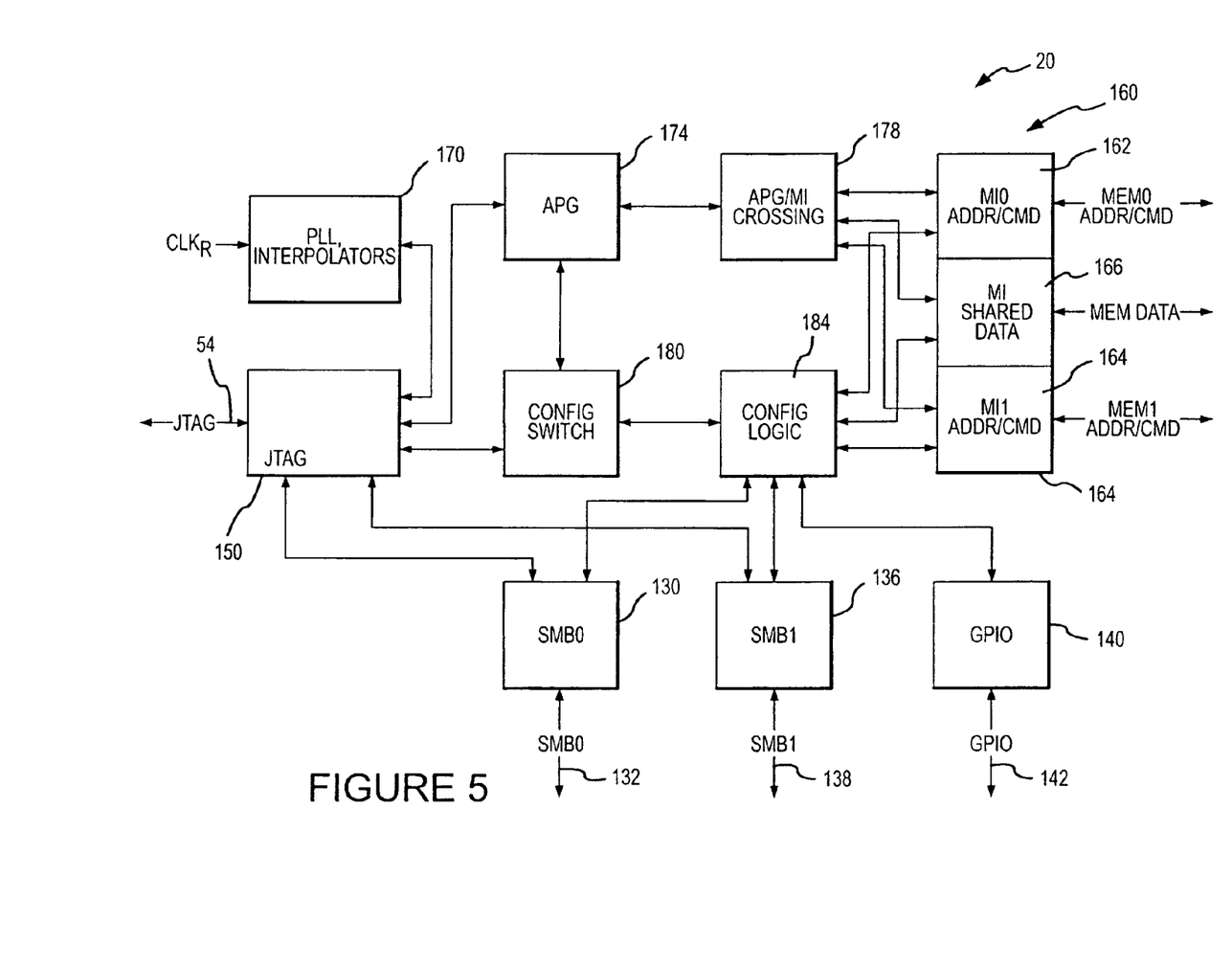
FIG. 5 is a more detailed block diagram of a integrated test circuit used in the load board of FIGS. 2A and 2B.

The architecture of the integrated test circuit 20 is shown in greater detail in FIG. 5. The integrated test circuit 20 includes several interfaces for coupling signals to and from the DUT chip 20. A first SMBus interface 130 is coupled to the analog-to-digital converter 80, the digital-to-analog converter 82, the board ID 86, and the CPU 52 (FIG. 4) through a SMB0 bus 132. A second SMBus interface 136 is coupled to the PROM 124 (FIG. 4) through a SMB1 bus 138. A general-purpose input/output ("GPIO") interface 140 is likewise coupled to the clock generator 110 (FIG. 4) through a GPIO bus 142. The JTAG test commands and result data are coupled through the JTAG bus 54 and a JTAG interface 150. Finally, a memory interface 160 includes a first unidirectional address/command interface 162 for coupling address and command signals to four of the memory devices 34a-d, a second unidirectional address/command interface 164 for coupling address and command signals to the remaining four memory devices 34e-h, and a bidirectional data interface 166 for coupling write data to and read data from the memory devices 34a-h.

The timing of signals coupled from the integrated test circuit 20 to the memory device 34 is derived from internal clock signals generated by a phase locked loop ("PLL") 170. As is well-known in the art, the phase locked loop 170 includes a voltage controlled oscillator having a phase that is locked to the phase of a reference clock signal $CLK_R$. The reference clock signal is, in this case, the clock signal from the clock generator 110 (FIG. 4). The phase locked loop 170 includes a conventional phase interpolator so that the clock signals generated by the phase locked loop 170 can have a variety of phases relative to the phase of the reference clock signal. The internal clock signals are coupled to the JTAG interface 150, and from the JTAG interface 150 to an algorithmic pattern generator ("APG") 174. The automatic pattern generator 174 generates a pattern of write data that is stored in the memory devices 34a-h. This pattern of data is coupled to a clock domain crossing circuit 178, which allows the data to pass from the clock domain of the reference clock signal from the clock generator 110 to the clock domain of the memory device 34. By using a variety of phases of the internal clock signal from the phase locked loop 170, the integrated test circuit 20 is able to vary the timing of command, address and write data signals applied to the memory devices 34a-h to test the timing margins of the memory device 34a-h.

Finally, the integrated test circuit 20 includes a configuration switch 180 and configuration logic 184 that function together to configure the integrated test circuit 20 based on the characteristics of the memory devices 34a-h.

Figure 6:
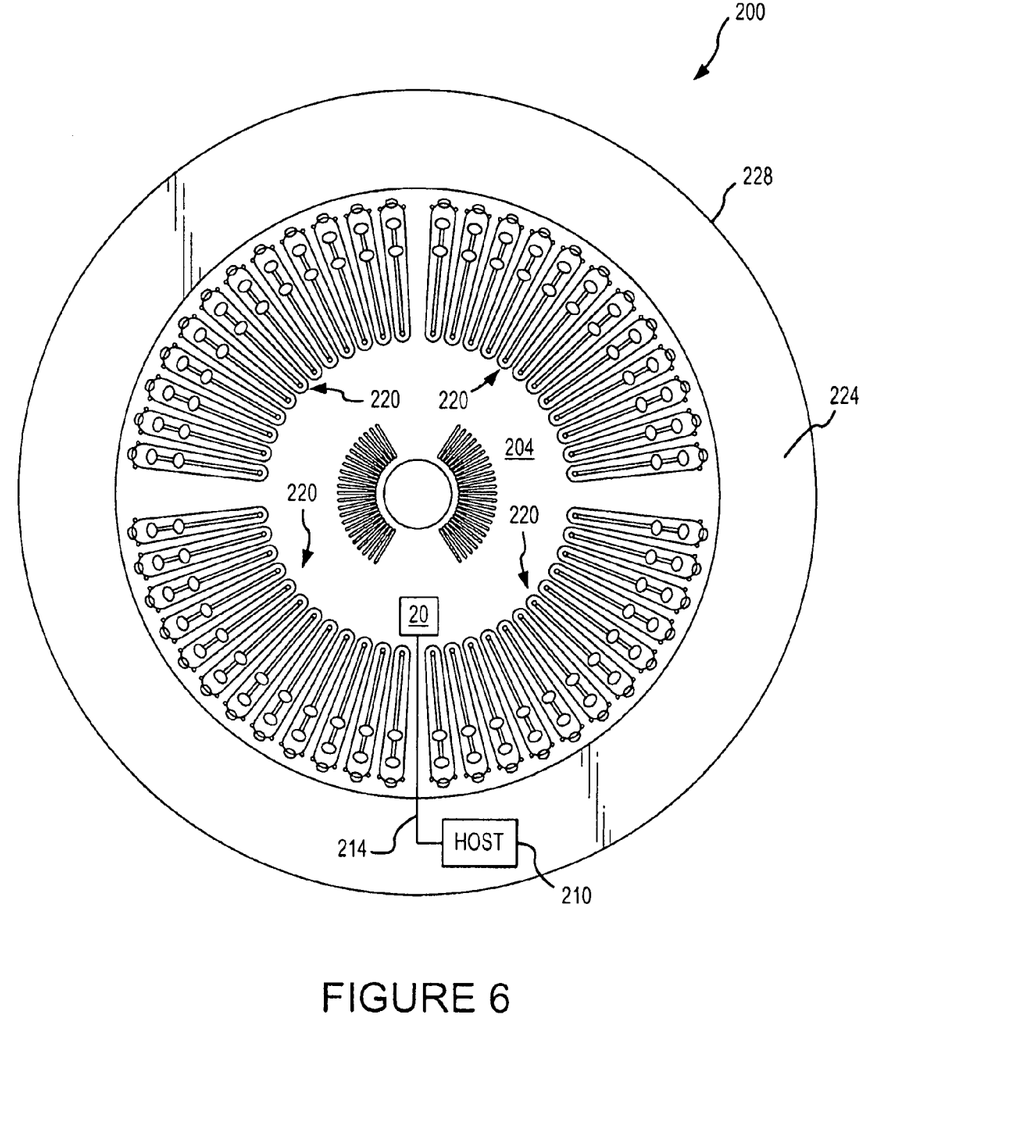
FIG. 6 is an isometric view of a integrated circuit wafer probe card containing an integrated test circuit according to one embodiment of the invention.

Although the integrated test circuit 20 may be mounted on a load board 14 as described above with reference to FIGS. 1-5, it may also be used in other contexts, such as on an integrated circuit probe card 200 as shown in FIG. 6. The probe card 200 includes a substrate 204 on which the integrated test circuit 20 is mounted. The test circuit 20 is coupled to a host 210 through a suitable communications link 214, such as a JTAG interface. The integrated circuit test circuit 20 is also coupled to conductive integrated circuits probes 220. The ends of the probes 220 make contact with pads formed on integrated circuits 224 fabricated on a wafer 228. The integrated circuit test circuit 20 operates in substantially the same manner as described above to test the integrated circuits 224 and report the results of the tests to the host 210.

Although the present invention has been described with reference to the disclosed examples, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A probe card for testing the integrated circuits in wafer form, the probe card comprising:
    a substrate;
    a plurality of conductive integrated circuit probes carried by and extending from the substrate;
    an integrated test circuit mounted on the substrate and coupled to the integrated circuit probes, the integrated test circuit being operable to apply test signals to the integrated circuits through the integrated circuit probes responsive to a test command, the integrated test circuit further being operable to receive response signals from the integrated circuits through the integrated circuit probes and to provide test results data derived from the response signal; the integrated test circuit comprising:
        a pattern generator operable to generate a pattern of test signals;
        a clock domain crossing buffer operable to transfer the pattern of test signals from a clock domain of the pattern generator to a clock domain of the integrated circuits; and
        a configuration switch operable to couple configuration data to the integrated test circuit, the integrated test circuit using the configuration data to control the manner in which the test signals are applied to the integrated circuit probes.

2. The probe card of claim 1 wherein the integrated circuits comprise dynamic random access memory devices.

3. The probe card of claim 2 wherein the integrated test circuit comprises:

an integrated circuit interface coupled to the pattern generator and to the integrated circuit probes, the pattern generator being operable to apply the pattern of test signals to the integrated circuits through the integrated circuit probes.

4. The probe card of claim 3 wherein the clock domain crossing buffer couples the pattern generator to the integrated circuit probes.

5. A method of testing an integrated circuit, comprising:

generating a pattern of test signals on a probe card responsive to a test command coupled to the probe card;

coupling a clock signal to the integrated circuit;

applying the pattern of test signals to the integrated circuit through the probe card by adjusting the timing at which the pattern of test signals are applied to the integrated circuit relative to the timing of the clock signal;

generating configuration data on the probe card, the configuration data operable to configure the pattern of test signals based on the characteristics of the integrated circuit, wherein the configuration data controls the manner in which test signals are applied to the integrated circuit;

receiving test results data from the integrated circuits through the probe card, the test results data being indicative of the manner in which the integrated circuit responded to the pattern of test signals; and coupling information corresponding to the test results data from the probe card.

6. The method of claim 5 wherein the integrated circuit comprises an integrated memory device.

7. The method of claim 6 wherein the memory device comprises an integrated dynamic random access memory device.

8. The method of claim 6 wherein the test signals comprise write data signals, and wherein the test results data comprise data read from the memory device.

9. A probe card, comprising:

a substrate;

a plurality of conductive probes mounted on the substrate, the conductive probes operable to couple test signals to integrated circuits;

an integrated test circuit mounted on the substrate, the integrated test circuit operable to receive a reference clock signal, the integrated test circuit operable to generate a second clock signal that controls the rate at which the test signals are applied to the integrated circuits, wherein the rate at which the test signals are applied to the integrated circuit is different from the reference clock signal; and a configuration circuit operable to generate configuration data, the configuration data operable to configure the integrated test circuit based on the characteristics of the integrated circuit, wherein the configuration data controls the manner in which the test signals are applied to the integrated circuits.

10. The probe card of claim 9 wherein the second clock signal is generated by a phase locked loop.

11. The probe card of claim 9 wherein the substrate comprises a first surface and an opposing second surface, the conductive probes mounted on the first surface and the integrated test circuit mounted on the second surface.

* * * * *

UNITED STATES PATENT AND TRADEMARK OFFICE
CERTIFICATE OF CORRECTION

PATENT NO. : 7,521,948 B2 Page 1 of 1
APPLICATION NO. : 11/784346
DATED : April 21, 2009
INVENTOR(S) : Jeddeloh et al.

It is certified that error appears in the above-identified patent and that said Letters Patent is hereby corrected as shown below:

In column 7, line 25, in Claim 5, delete "circuits" and insert -- circuit --, therefor.

Signed and Sealed this

Fourteenth Day of July, 2009

JOHN DOLL
*Acting Director of the United States Patent and Trademark Office*